United States Patent
Parker et al.

(10) Patent No.: US 10,491,428 B2
(45) Date of Patent: Nov. 26, 2019

(54) CURRENT SUPPLY FOR AN OPTO-ELECTRONIC DEVICE

(71) Applicant: HEWLETT PACKARD ENTERPRISE DEVELOPMENT LP, Houston, TX (US)

(72) Inventors: Clinton Harold Parker, Fort Collins, CO (US); Zhubiao Zhu, Fort Collins, CA (US); Daniel Alan Berkram, Loveland, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/965,760

(22) Filed: Apr. 27, 2018

(65) Prior Publication Data

US 2019/0334742 A1 Oct. 31, 2019

(51) Int. Cl.
*H04L 25/02* (2006.01)
*H03K 17/687* (2006.01)
*H03K 17/06* (2006.01)

(52) U.S. Cl.
CPC ....... *H04L 25/0298* (2013.01); *H03K 17/063* (2013.01); *H03K 17/6871* (2013.01)

(58) Field of Classification Search
CPC ... H01S 3/0007; H04L 25/0298; H04L 25/03; H04L 25/03006; H03K 17/6871
See application file for complete search history.

(56) References Cited

U.S. PATENT DOCUMENTS

| | | | |
|---|---|---|---|
| 3,506,819 A | 4/1970 | Gervasio | |
| 4,547,737 A | 10/1985 | Gibson | |
| 4,551,691 A | 11/1985 | Ogawa | |
| 5,581,454 A | 12/1996 | Collins | |

(Continued)

FOREIGN PATENT DOCUMENTS

| CN | 104135272 | 11/2014 |
|---|---|---|
| KR | 10-0951659 B1 | 4/2010 |

OTHER PUBLICATIONS

IO Impedance Matching Algorithm for High-Performance ASICs_ Retrieved via Google Scholar.

(Continued)

*Primary Examiner* — Thomas J. Hiltunen
(74) *Attorney, Agent, or Firm* — McDermott Will & Emery (US LC)—USD (57) ABSTRACT

A device, including a first current supply configured to provide a bias current to a load and a main current supply having a source terminal coupled in parallel with the load and configured to reduce a current value to the load below the bias current, is provided. The device includes a termination resistor coupled in series with the source terminal of the main current supply and configured to receive current from the source terminal of the main current supply when the source terminal of the main current supply is activated. The device also includes an auxiliary current supply having a sink terminal coupled to the termination resistor at a common node, and configured to maintain the common node at common mode voltage when current flows from the source terminal of the main current supply to the sink terminal of the auxiliary current supply and through the termination resistor.

17 Claims, 5 Drawing Sheets

(56) References Cited

U.S. PATENT DOCUMENTS

| | | | |
|---|---|---|---|
| 5,859,862 A * | 1/1999 | Hikasa | G11B 7/126 |
| | | | 372/31 |
| 6,016,073 A | 1/2000 | Ghilardelli et al. | |
| 6,788,148 B2 | 9/2004 | Orr | |
| 6,977,533 B2 | 12/2005 | Kernhof | |
| 7,282,993 B2 | 10/2007 | Okamoto | |
| 7,528,625 B2 * | 5/2009 | Ozasa | H03H 7/25 |
| | | | 326/26 |
| 7,671,882 B2 * | 3/2010 | Ozasa | H04N 1/40037 |
| | | | 347/237 |
| 7,915,933 B2 | 3/2011 | Vlasenko et al. | |
| 8,008,953 B1 | 8/2011 | Brumett, Jr. et al. | |
| 8,022,736 B2 | 9/2011 | Chang | |
| 8,525,487 B1 | 9/2013 | Stevenson | |
| 8,638,610 B2 | 1/2014 | Imai et al. | |
| 8,660,158 B2 * | 2/2014 | Miyajima | H01S 5/0428 |
| | | | 372/38.02 |
| 8,861,560 B2 * | 10/2014 | Nedovic | H01S 5/0427 |
| | | | 372/38.02 |
| 8,929,746 B2 * | 1/2015 | Azadeh | H01S 5/042 |
| | | | 398/192 |
| 8,947,008 B2 | 2/2015 | Chuang et al. | |
| 9,007,092 B2 | 4/2015 | Kozuma et al. | |
| 9,161,403 B2 * | 10/2015 | Sugawara | H05B 33/0818 |
| 9,300,283 B1 | 3/2016 | Jain et al. | |
| 9,306,555 B2 * | 4/2016 | Muljono | H03K 17/04123 |
| 9,401,703 B1 | 7/2016 | Wang et al. | |
| 9,603,210 B1 | 3/2017 | Carlen | |
| 9,614,511 B2 | 4/2017 | Blecher | |
| 9,781,789 B1 | 10/2017 | Lee | |
| 9,810,928 B2 | 11/2017 | Pobanz | |
| 2002/0176285 A1 | 11/2002 | Hunt | |
| 2006/0226916 A1 | 10/2006 | Florescu et al. | |
| 2008/0117943 A1 | 5/2008 | Nishiyama | |
| 2013/0187683 A1 | 7/2013 | Foroudi | |
| 2014/0184334 A1 | 7/2014 | Nobbe et al. | |
| 2016/0191029 A1 | 6/2016 | Shuvalov | |
| 2016/0269120 A1 | 9/2016 | Halbritter | |
| 2017/0133989 A1 | 5/2017 | Dykstra et al. | |
| 2017/0141735 A1 | 5/2017 | Yuan et al. | |
| 2017/0155384 A1 | 6/2017 | Fujino | |
| 2017/0187553 A1 | 6/2017 | Nedovic | |
| 2018/0302070 A1 | 10/2018 | Parvizi et al. | |
| 2018/0337732 A1 * | 11/2018 | Ogata | H04B 10/40 |
| 2019/0045283 A1 * | 2/2019 | Troiani | H04B 10/502 |

OTHER PUBLICATIONS

Farjad-Rad, R.; "A CMOS 4-PAM Multi-Gbps Serial Link Transceiver"; Aug. 2000; 194 pages.

Kozlov, V.; "Capacitively Coupled CMOS VCSEL Driver Circuits for Optical Communication"; 2015; 120 pages.

Steffan et al., "A 64Gb/s PAM-4 Transmitter with 4-Tap FFE and 2.26pJ/b Energy Efficiency in 28nm CMOS FDSOI", IEEE International Solid-State Circuits Conference, 2017, 3 pages.

Quadir et al, "A 56Gb/s PAM-4 VCSEL driver circuit", ISSC 2012, NUI Maynooth, Jun. 2012, 6 pages.

OIF, "Optical Interconnect Forum", available online at <http://www.oiforum.com>, accessed on Nov. 3, 2016, 4 pages.

Nazemi et al., "A 36Gb/s PAM4 Transmitter Using an 8b 18GS/s DAC in 28nm CMOS," IEEE International Solid-State Circuits Conference (ISSCC), 2015, 3 pages.

Lee et al., "Design of 56 Gb/s NRZ and PAM4 SerDes Transceivers in CMOS Technologies", IEEE Journal of Solid-State Circuits, vol. 50, No. 9, Sep. 2015, pp. 2061-2073.

Kim et al., "A 16-to-40Gb/s Quarter-Rate NRZ/PAM4 Dual-Mode Transmitter in 14nm CMOS", IEEE International Solid-State Circuits Conference (ISSCC), 2015, 3 pages.

Bassi et al., "A 45Gb/s PAM-4 transmitter delivering 1.3Vppd output swing with 1V supply in 28nm CMOS FDSOI", International Solid-State Circuits Conference (ISSCC), 2016, pp. 1-28.

International Search Report and Written Opinion received for PCT Patent Application No. PCT/US19/29482, dated Sep. 10, 2019, 14 pages.

\* cited by examiner

CURRENT SUPPLY FOR AN OPTO-ELECTRONIC DEVICE

TECHNICAL FIELD

Embodiments described herein are generally related to the field of opto-electronic device transducers. More specifically, embodiments described herein are related to compact and efficient current supplies for opto-electronic data conversion.

BACKGROUND

Current opto-electronic systems are expected to operate at high data rates that impose stringent conditions on the capacitive response of the driver terminations. To reduce ground impedance for high frequency alternate current (AC) components and to maintain a stable charge level for the device, current solutions implement large capacitors in the driver circuits. However, these large capacitors reduce the area efficiency of the circuit and add to a sluggish response of the device. In some approaches, a voltage source may be added to the circuitry to maintain a common mode voltage and guarantee that the device response is stable, regardless of the data conditions to which it is subjected.

The description provided in the background section should not be assumed to be prior art merely because it is mentioned in or associated with the background section. The background section may include information that describes one or more aspects of the subject technology.

SUMMARY

In certain aspects, a device as disclosed herein includes a first current supply configured to provide a bias current to a load, a main current supply having a source terminal coupled in parallel with the load and configured to reduce a current value to the load below the bias current. The device also includes a termination resistor coupled in series with the source terminal of the main current supply and configured to receive a current from the source terminal of the main current supply when the source terminal of the main current supply is activated and an auxiliary current supply having a sink terminal coupled to the termination resistor at a common node, and configured to maintain the common node at a common mode voltage when a current flows from the source terminal of the main current supply to the sink terminal of the auxiliary current supply and through the termination resistor.

In certain aspects, a system as disclosed herein includes a light emitting device, a data channel configured to provide a data signal and a complementary signal to the data signal, and a first current supply configured to provide a bias current to the light emitting device. The system also includes a main current supply having a source terminal coupled in parallel with the light emitting device and configured to reduce a current value to the light emitting device below the bias current and a termination resistor coupled in series with the source terminal of the main current supply and configured to receive a current from the source terminal of the main current supply when the source terminal of the main current supply is activated. The system also includes an auxiliary current supply having a sink terminal coupled to the termination resistor at a common node, and configured to maintain the common node at a common mode voltage when a current flows from the source terminal of the main current supply to the sink terminal of the auxiliary current supply and through the termination resistor.

In certain aspects, a serial interface includes an opto-electronic data link. The opto-electronic data link includes a light emitting device, a data channel configured to provide a data signal and a complementary data signal, and a first current supply configured to provide a bias current to the light emitting device. The opto-electronic data link also includes a main current supply having a source terminal coupled in parallel with the light emitting device and configured to reduce a current value to the light emitting device below the bias current, a termination resistor coupled in series with the source terminal of the main current supply and configured to receive a current from the source terminal of the main current supply when the source terminal of the main current supply is activated. The opto-electronic data link also includes an auxiliary current supply having a sink terminal coupled to the termination resistor at a common node, and configured to maintain the common node at a common mode voltage when a current flows from the source terminal of the main current supply to the sink terminal of the auxiliary current supply and through the termination resistor, and a processor configured to determine an auxiliary current from the auxiliary current supply and a main current from the main current supply based on an updated value of a resistance of the light emitting device and of the termination resistor.

In certain aspects, a system is described including a means for emitting light. The system further includes a means to provide a current to the means for emitting light. The means to provide a current includes a data channel configured to provide a data signal and a complementary signal to the data signal, and a first current supply configured to provide a bias current to the light emitting device. The means to provide a current also includes a main current supply having a source terminal coupled in parallel with the light emitting device and configured to reduce a current value to the light emitting device below the bias current and a termination resistor coupled in series with the source terminal of the main current supply and configured to receive a current from the source terminal of the main current supply when the source terminal of the main current supply is activated. The means to provide a current also includes an auxiliary current supply having a sink terminal coupled to the termination resistor at a common node, and configured to maintain the common node at a common mode voltage when a current flows from the source terminal of the main current supply to the sink terminal of the auxiliary current supply and through the termination resistor.

BRIEF DESCRIPTION OF THE DRAWINGS

In the figures, elements and steps denoted by the same or similar reference numerals are associated with the same or similar elements and steps, unless indicated otherwise.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

Drivers for application specific integrated circuit (ASIC) input/output (IO) are typically terminated with a resistance equal to the characteristic impendence of the channel they are driving. This termination is required in order to prevent any reflections coming back from the load or other discontinuities from reflecting a second time and corrupting the transmitted signal. To accomplish this termination, a resistor is usually connected between the driver output and either the VSS or VDD voltage sources. These sources act as an AC ground for the termination resistor. However, in some circumstances, the voltage source used may need to be a value other than VDD and VSS. This invention uses two auxiliary current sources to produce a virtual voltage source for the termination resistor of an ASIC IO driver.

The disclosed system provides a solution to the problem of stabilizing the voltage at the common node of the termination resistor that provides a substantial reduction of capacitive resources and on-chip real estate. When a voltage source other than VDD and VSS is required to be an AC ground for a termination resistor, there are three common ways to solve the problem. One approach provides an additional voltage source to the ASIC, which adds an additional pin to the package. Another approach is to put a regulator on chip and derive the new voltage from an existing voltage. However, voltage regulators typically take large areas of the chip and use substantial amount of power. Some approaches use a large capacitor to act as an AC ground in place of the voltage source. However, these approaches involve large capacitive resources and also consume large on-chip area. Embodiments disclosed herein overcome these problems by using a dual stage current source, and a relatively smaller capacitor as the AC ground for the termination resistor.

Figure 1:
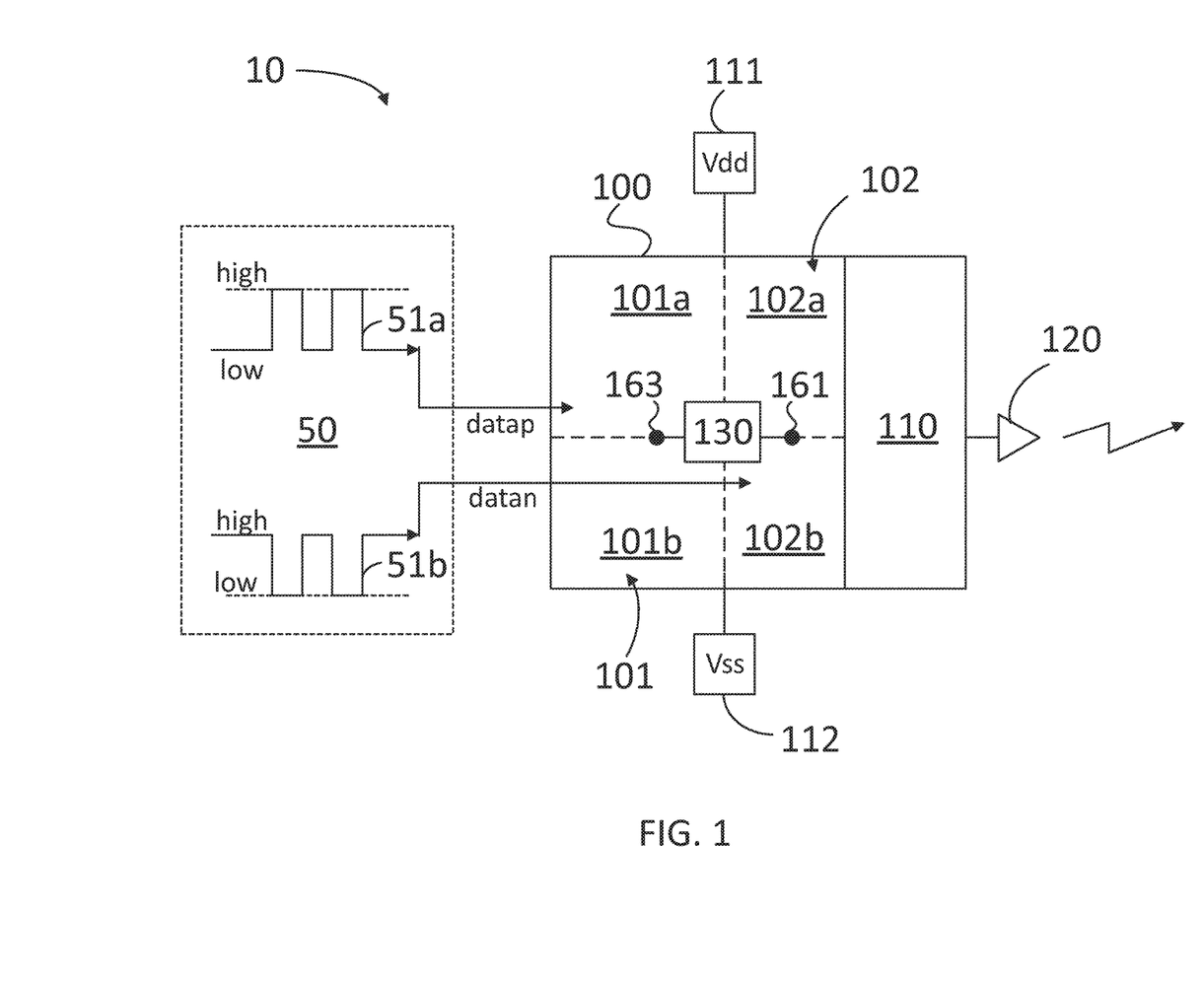
FIG. 1 illustrates an opto-electronic system including a dual stage current supply, according to some embodiments.

FIG. 1 illustrates an opto-electronic system 10 including a dual stage current supply 100, according to some embodiments. Opto-electronic system 10 includes a light emitting device 120, and a data channel 50 configured to provide a data signal 51a ('datap') to a main current supply 101 and to provide a complementary data signal 51b ('datan') to an auxiliary current supply 102. Complementary data signal 51b may be characterized in that it is 'low' when data signal 51a is 'high,' and it is high when data signal 51a is low. Hereinafter, data signal 51a and complementary data signal 51b will be collectively referred to as "data signals 51." Dual stage current supply 100 is powered by a high voltage supply 111 (Vdd) and a low voltage supply 112, or sink (Vss, e.g., ground).

A first current supply 110 in dual stage current supply 100 is configured to provide a bias current to light emitting device 120. Main current supply 101, has a source terminal 101a, is coupled in parallel with light emitting device 120 and is configured to reduce a current value to light emitting device 120 below the bias current. Dual stage current supply 100 also includes a termination resistor 130 coupled with source terminal 101a and configured to receive a current from source terminal 101a when it is activated. Auxiliary current supply 102 has a sink terminal 102b coupled to termination resistor 130 at a common node 161, is configured to maintain common node 161 at a common mode voltage when a current flows from source terminal 101a to sink terminal 102b and through termination resistor 130. Termination resistor 130 includes an output node 163 at the opposite side of common node 163. Dual stage current supply 100 is configured such that depending on data signals 51 from data channel 50, a current through resistor 130 may flow from common node 161 to output node 163, or from output node 163 to common node 161, while a voltage ($V_{cm}$) of common node 161 is held constant.

In some embodiments, data channel 50 is configured to activate source terminal 101a and sink terminal 102b when data signal 51a is a low value (e.g., complementary data signal 51b is a high value), thereby lowering a current to light emitting device 120 below the bias current value, and reducing optical power output from opto-electronic system 10. Likewise, data channel 50 is configured to activate source terminal 102a and sink terminal 101b when data signal 51a is a high value (e.g., complementary data signal 51b is a low value), thereby increasing a current to light emitting device 120 above the bias current value, and increasing optical power output from opto-electronic system 10.

Figure 2:
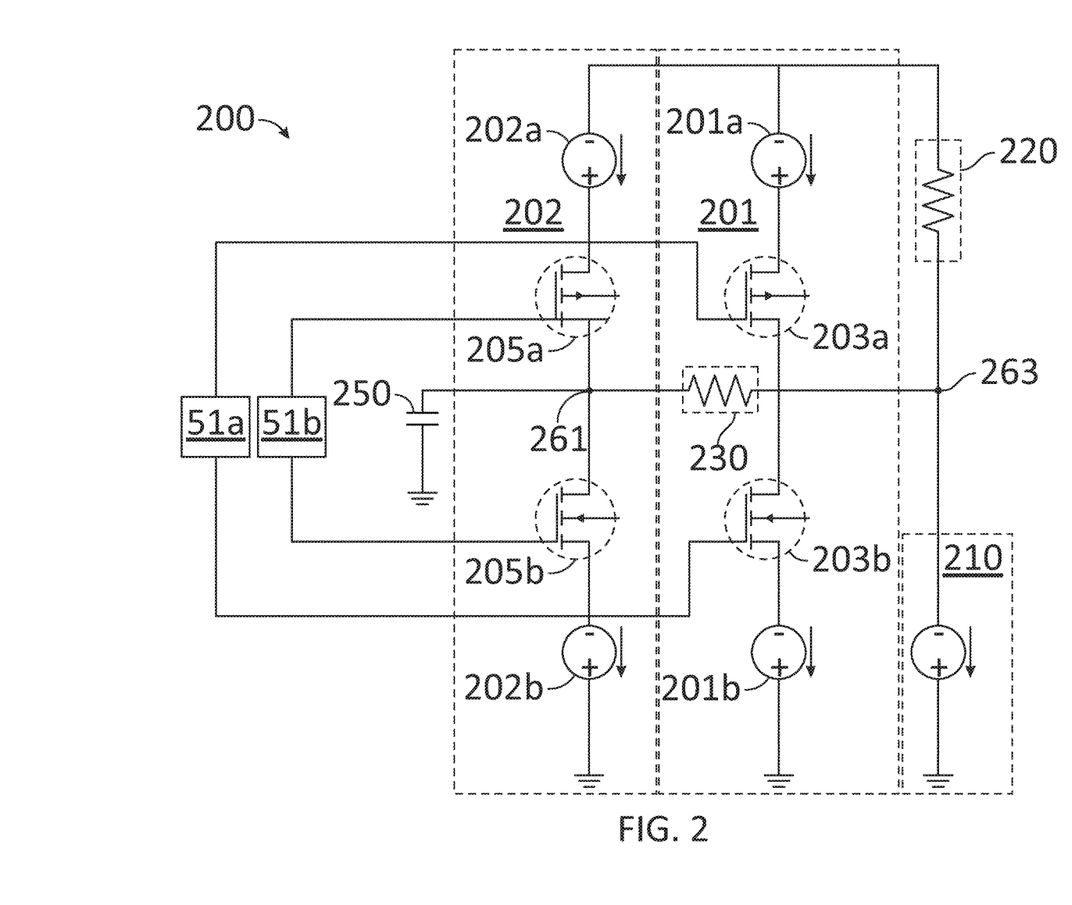
FIG. 2 illustrates a dual-stage current supply including a main current supply and an auxiliary current supply, according to some embodiments.

FIG. 2 illustrates a dual-stage current supply 200 including a main current supply 201 and an auxiliary current supply 202 (cf. dual-stage current supply 100, main current supply 101 and auxiliary current supply 102), according to some embodiments. Dual-stage current supply 200 may also include a first current supply 210 configured to provide a bias current to a load 220. Dual stage current supply 200 includes a main current supply 201, which has a source terminal 201a coupled in parallel with load 220 and configured to reduce a current value to load 220 below the bias current. Dual stage current supply 200 includes a termination resistor 230 (cf. termination resistor 130) coupled in series with source terminal 201a of the main current supply and configured to receive a current from source terminal 201a when source terminal 201a is activated. In some embodiments, termination resistor 230 is coupled in series with source terminal 201a through a switch 203a that is activated with data signal 51a (cf. opto-electronic system 10). In some embodiments, switch 203a may include a transistor, such as a field-effect transistor (FET). For example, in some embodiments, switch 203a includes a positive channel FET (PFET) configured to be turned 'on' by a low value of data signal 51a, and turned 'off' by a high value of data signal 51a.

Dual stage current supply 200 also includes auxiliary current supply 202 having a sink terminal 202b coupled to termination resistor 230 at a common node 261 (cf common node 161). Sink terminal 202b is configured to maintain common node 261 at a common mode voltage ($V_{cm}$) when a current flows from source terminal 201a to the sink terminal 202b through termination resistor 230. In some embodiments, load 220 is a vertical emitting laser diode, and common mode voltage 261 includes a middle value between a 'one' and a 'zero' state of the vertical emitting laser diode. In some embodiments, sink terminal 202b is coupled to termination resistor 230 through a switch 205b that is activated with complementary data signal 51b (cf opto-electronic system 10). Switch 205b may include a transistor, such as a field-effect transistor (FET). For example, in some embodiments, switch 203a includes a negative channel FET (NFET) configured to be turned 'on' by a high value of complementary data signal 51b, and turned 'off' by a low value of complementary data signal 51b. In some embodiments, $V_{cm}$ may be driven and held fixed by a voltage source, at the cost of device real state and circuit complexity.

In some embodiments, dual stage current supply 200 includes a capacitor 250 coupled in parallel to sink terminal 202b at common node 261. In some embodiments, capacitor 250 is configured to provide a ground termination to an alternate current signal from termination resistor 230. Accordingly, capacitor 250 and termination resistor 230 are configured to provide a time constant of multiple clock signals for load 220, wherein a clock signal is defined by data signals 51 (e.g., a low-to-high or high-to-low transition). In some embodiments, capacitor 250 acts as an alternate-current (AC) ground for the resistor.

In some embodiments, load 220 represents the characteristic impendence of the channel being driven on a resistive load. In some embodiments, first current supply 110 may provide a direct-current (DC) bias current of about 6 mA for load 220. As data signal 51a switches from low to high value, dual-stage current supply 200 modulates current around the DC bias point of 6 mA. Accordingly, a first portion of the current provided by main current supply 101 ($I_{main}$) is directed to load 220 and a second portion of $I_{main}$ is directed toward resistor 230, according to a resistor divider formed between resistor 230 and load 220. In some embodiments, when resistor 230 is equal to load 220, a current directed toward load 220 will be $I_{main}/2$. The current in resistor 230 may flow from common node 261 to an output node 263, or in the opposite direction, depending of the value of data signals 51.

In some embodiments, capacitor 250 supplies a current to hold $V_{cm}$ constant as $I_{main}$ fluctuates between a pull up and a pull down condition, or when data signals 51 include a long string of high values ('1's') or low values ('0's'). In some embodiments, this current may be provided by a large capacitor 250. In some cases, capacitor 250 may be too large to be practical and a voltage regulator be included in the circuit to supply the $V_{cm}$ voltage. To alleviate these constraints, complementary data signal 51b is configured to turn 'on' auxiliary current source 202 to supply current ($I_{aux}$) to resistor 230 and maintain $V_{cm}$ constant.

In some embodiments, auxiliary current supply 202 further comprises a source terminal 202a coupled with resistor 230 at common node 261. Source terminal 202a is configured to provide a current, $I_{aux}$, to maintain the common node at $V_{cm}$, when the source terminal of the main current supply is deactivated and the current value to the load is above the bias current.

In some embodiments, main current supply 201 includes a sink terminal 201b, coupled with resistor 230 at output node 263. Accordingly, sink terminal 201b may be configured to provide a current through resistor 230 from common node 261 to output node 263. This results in an increase of the current value to load 220 above the bias current when the source terminal of the main current supply is deactivated.

In some embodiments, main current supply 201 and auxiliary current supply 202 are configured such that a ratio between $I_{main}$ and $I_{aux}$ is proportional to a ratio between a resistor 230 ($R_{tem}$) and a resistance of load 220 ($R_{load}$), as follows:

$$I_{main} \text{ and } I_{aux} \cdot I_{aux}/I_{main} = R_{load}/(R_{tem}+R_{load}) \qquad (1)$$

In some embodiments, source terminal 201a and sink terminal 201b are coupled to a complementary channel set of field-effect transistors (e.g., PFET for source terminal 201a, and NFET for sink terminal 201b). Likewise, in some embodiments, source terminal 202a and sink terminal 202b may include a complementary channel set of field effect transistors (e.g., PFET for source terminal 202a, and NFET for sink terminal 202b).

Figure 3A:
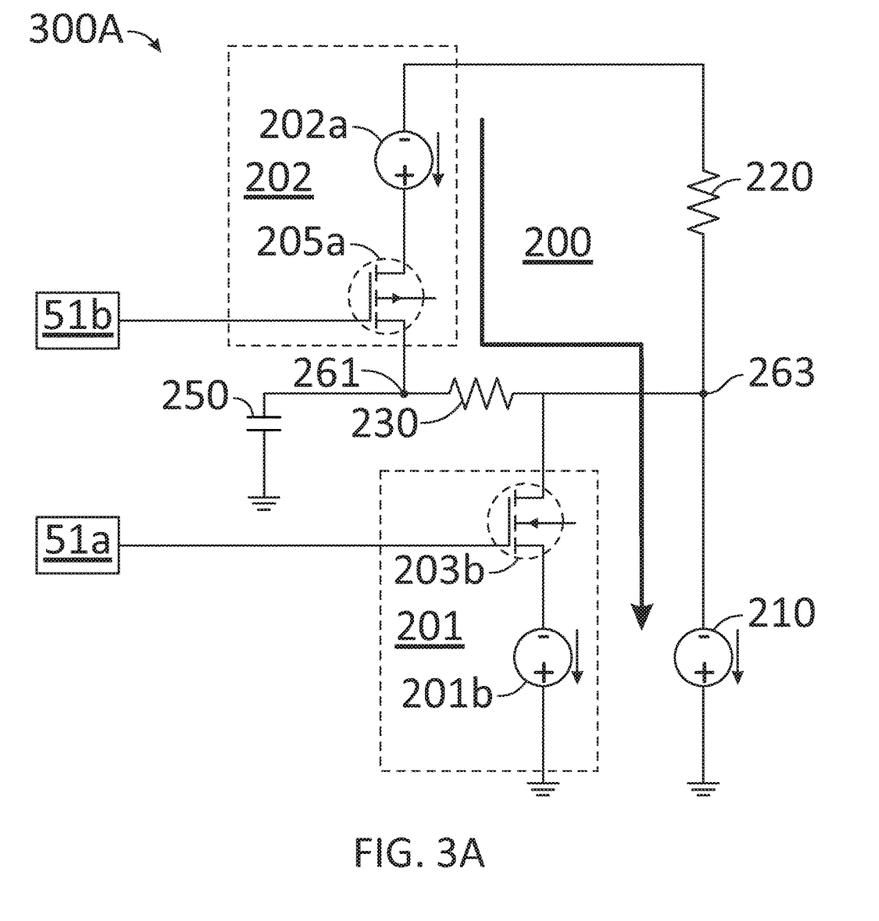
FIG. 3A illustrates a dual-stage current supply configured to pull a signal in an opto-electronic system from a low state to a high state, according to some embodiments.

FIG. 3A illustrates a partial view 300A of dual-stage current supply 200 configured to pull a signal in an opto-electronic system (cf. opto-electronic system 10) from a low state to a high state, according to some embodiments. Data signal 51a is high, thereby turning switch 203b (e.g., an NFET), and sink terminal 201b, on. Complementary data signal 51b is low, thereby turning switch 205a (e.g., a PFET) on. Accordingly, auxiliary current supply 202 provides $I_{aux}$ from source terminal 202a to maintain $V_{cm}$ fixed when source terminal 201a is deactivated. Current $I_{aux}$ flows through resistor 230 from common node 261 to output node 263, thus pulling down the voltage of output node 263 ($V_{cm}$ is held fixed). Accordingly, the voltage drop across load 220 increases, inducing a current value through load 220 to rise above the bias current provided by first current supply 210. Capacitor 250 provides an AC ground for resistor 230.

Figure 3B:
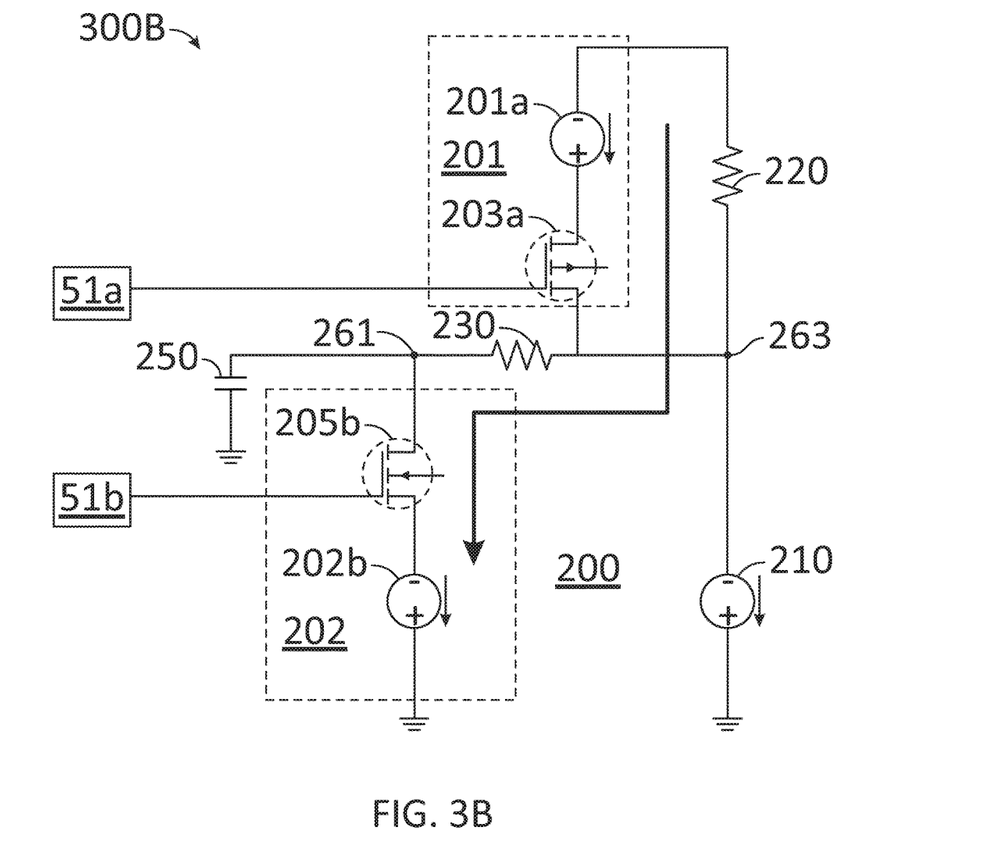
FIG. 3B illustrates a dual-stage current supply configured to pull a signal in an opto-electronic system from a high state to a low state, according to some embodiments.

FIG. 3B illustrates a partial view 300B of dual-stage current supply 200 configured to pull a signal in an opto-electronic system (cf. opto-electronic system 10) from a high state to a low state, according to some embodiments. Data signal 51a is low, thereby turning switch 203a (e.g., a PFET) on. Complementary data signal 51b is high, thereby turning switch 205b (e.g., a PFET) on. Accordingly, main current supply 201 provides $I_{aux}$ from source terminal 201a, and sink terminal 202b maintains $V_{cm}$ at a constant value when a portion of $I_{main}$ flows through resistor 230 from output node 263 to common node 261. Accordingly, the voltage of output node 263 is raised, thereby reducing a voltage drop across load 220. This reduces a current value through load 220 below the bias current provided by first current supply 210. Capacitor 250 provides an AC ground for resistor 230.

Figure 4:
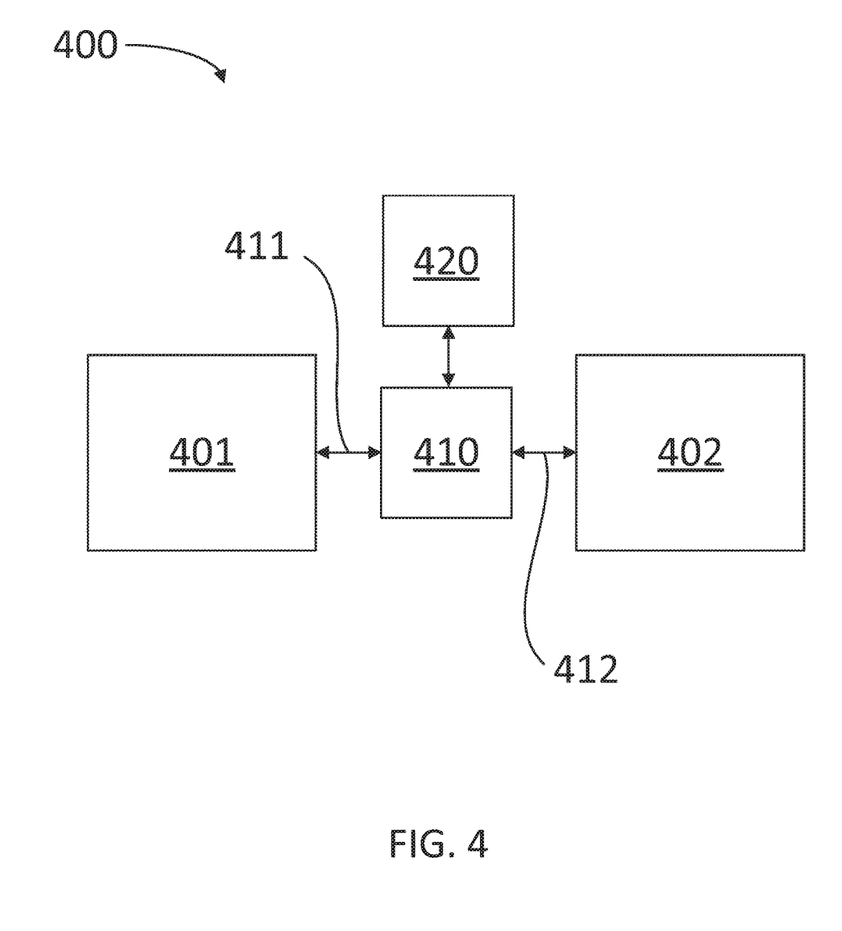
FIG. 4 illustrates a serial interface for transducing an electrical signal from a transmitter into an optical signal for a receiver, according to some embodiments.

FIG. 4 illustrates a serial interface 400 for transducing an electrical signal 411 from a transmitter 401 into an optical signal 412 for a receiver 402, according to some embodiments. Serial interface 400 includes an opto-electronic data link 410 (cf. opto-electronic data link 10). In embodiments consistent with the present disclosure, opto-electronic data link 410 may include a light emitting device, a data channel configured to provide a data signal, a complementary data channel configured to provide a complementary signal to the data signal, a first current supply configured to provide a bias current to the light emitting device, and a main current supply having a source terminal coupled in parallel with the light emitting device and configured to reduce a current value to the light emitting device below the bias current (cf. light-emitting device 120, data channel 50, data signals 51, first current supplies 110 and 210, main current supplies 101 and 201). Opto-electronic data link 410 may also include a termination resistor coupled in series with the source terminal of the main current supply and configured to receive a current from the source terminal of the main current supply when the source terminal of the main current supply is activated, and an auxiliary current supply having a sink terminal coupled to the termination resistor at a common node, as disclosed herein (cf. auxiliary current supplies 102 and 202, and termination resistors 130 and 230).

In some embodiments, serial interface 400 also includes a processor 420 configured to determine an auxiliary current form the auxiliary current supply and a main current from the main current supply based on an updated value of a resistance of the light emitting device and of the termination resistor.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

To illustrate the interchangeability of hardware and software, items such as the various illustrative blocks, modules, components, methods, operations, instructions, and algorithms have been described generally in terms of their functionality. Whether such functionality is implemented as hardware, software, or a combination of hardware and software depends upon the particular application and design constraints imposed on the overall system. Skilled artisans may implement the described functionality in varying ways for each particular application.

As used herein, the phrase "at least one of" preceding a series of items, with the terms "and" or "or" to separate any of the items, modifies the list as a whole, rather than each member of the list (i.e., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

In one aspect, a term field effect transistor (FET) may refer to any of a variety of multi-terminal transistors generally operating on the principals of controlling an electric field to control the shape and hence the conductivity of a channel of one type of charge carrier in a semiconductor material, including, but not limited to, a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

To the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments. Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for."

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A device, comprising:
a first current supply configured to provide a bias current to a load;
a main current supply having a source terminal coupled in parallel with the load and configured to reduce a current value to the load below the bias current;
a termination resistor coupled in series with the source terminal of the main current supply and configured to receive a current from the source terminal of the main current supply when the source terminal of the main current supply is activated; and
an auxiliary current supply having a sink terminal coupled to the termination resistor at a common node, and configured to maintain the common node at a common mode voltage when a current flows from the source terminal of the main current supply to the sink terminal of the auxiliary current supply and through the termination resistor
wherein the main current supply comprises a sink terminal coupled with the termination resistor at an output node, and configured to provide a current from the common node to the output node of the termination resistor to increase the current value to the load above the bias current when the source terminal of the main current supply is deactivated.

2. The device of claim 1, further comprising a data channel configured to activate the source terminal of the main current supply and the sink terminal of the auxiliary current supply when a data value comprises a zero value.

3. The device of claim 1, further comprising a capacitor coupled in parallel to the sink terminal of the auxiliary current supply at the common node, and configured to provide a ground termination to an alternate current signal from the termination resistor, and wherein the capacitor and the termination resistor are configured to provide a time constant of multiple clock signals for the load.

4. The device of claim 1, wherein the auxiliary current supply further comprises a source terminal coupled with the termination resistor at the common node, the source terminal of the auxiliary current supply configured to provide a current to maintain the common node at the common mode voltage when the source terminal of the main current supply is deactivated and the current value to the load is above the bias current.

5. The device of claim 1, wherein the main current supply and the auxiliary current supply are configured such that a ratio between a main current from the main current supply and an auxiliary current from the auxiliary current supply is proportional to a ratio between a termination resistor and a resistance of the load.

6. The device of claim 1, wherein the source terminal of the main current supply and a sink terminal of the main current supply comprise a complementary channel set of field-effect transistors.

7. The device of claim 1, wherein a source terminal of the auxiliary current supply and the sink terminal of the auxiliary current supply comprise a complementary channel set of field effect transistors.

8. The device of claim 1, wherein the load is a vertical emitting laser diode, and the common mode voltage is a middle value between a 'one' and a 'zero' state of the vertical emitting laser diode.

9. A system, comprising:
a light emitting device;
a data channel configured to provide a data signal and a complementary signal to the data signal;
a first current supply configured to provide a bias current to the light emitting device;
a main current supply having a source terminal coupled in parallel with the light emitting device and configured to reduce a current value to the light emitting device below the bias current;
a termination resistor coupled in series with the source terminal of the main current supply and configured to receive a current from the source terminal of the main current supply when the source terminal of the main current supply is activated; and
an auxiliary current supply having a sink terminal coupled to the termination resistor at a common node, and configured to maintain the common node at a common mode voltage when a current flows from the source terminal of the main current supply to the sink terminal of the auxiliary current supply and through the termination resistor
wherein the main current supply comprises a sink terminal coupled with the termination resistor at an output node, and configured to provide a current from the common node to the output node of the termination resistor to increase the current value to the light emitting device above the bias current when the source terminal of the main current supply is deactivated.

10. The system of claim 9, further comprising a capacitor coupled in parallel to the sink terminal of the auxiliary current supply at the common node, and configured to provide a ground termination to an alternate current signal from the termination resistor, and wherein the capacitor and the termination resistor are configured to provide a time constant of multiple clock signals for the light emitting device.

11. The system of claim 9, wherein the auxiliary current supply further comprises a source terminal coupled with the termination resistor at the common node, the source terminal of the auxiliary current supply configured to provide a current to maintain the common node at the common mode voltage when the source terminal of the main current supply is deactivated and the current value to the light emitting device is above the bias current.

12. A serial interface, comprising:
an opto-electronic data link, comprising:
a light emitting device,
a data channel configured to provide a data signal and a complementary data signal, a first current supply configured to provide a bias current to the light emitting device, a main current supply having a source terminal coupled in parallel with the light emitting device and configured to reduce a current value to the light emitting device below the bias current, a termination resistor coupled in series with the source terminal of the main current supply and configured to receive a current from the source terminal of the main current supply when the source terminal of the main current supply is activated, and an auxiliary current supply having a sink terminal coupled to the termination resistor at a common node, and configured to maintain the common node at a common mode voltage when a current flows from the source terminal of the main current supply to the sink terminal of the auxiliary current supply and through the termination resistor; and a processor configured to determine an auxiliary current from the auxiliary current supply and a main current from the main current supply based on an updated value of a resistance of the light emitting device and of the termination resistor.

13. The serial interface of claim 12, wherein the processor is configured to determine a ratio, the ratio based on a proportion of the resistance of the light emitting diode to a sum of the resistance of the light emitting diode and the termination resistor, to determine the auxiliary current proportionally to the main current, based on the ratio.

14. The serial interface of claim 12, wherein the auxiliary current supply in the opto-electronic data link comprises a source terminal coupled with the termination resistor at the common node, and configured to maintain the common node at the common mode voltage when the current value to the light emitting device above the bias current.

15. The serial interface of claim 12, wherein the source terminal of the main current supply and a sink terminal of the main current supply in the opto-electronic data link comprise a complementary channel set of field-effect transistors.

16. The serial interface of claim 12, wherein a source terminal of the auxiliary current supply and the sink terminal of the auxiliary current supply in the opto-electronic data link comprise a complementary channel set of field effect transistors.

17. The serial interface of claim 12, wherein the light emitting device in the opto-electronic data link is a vertical emitting laser diode, and the common mode voltage is a middle value between a 'one' and a 'zero' state of the vertical emitting laser diode.

* * * * *